(12) United States Patent
Ozaki

(10) Patent No.: US 6,561,510 B2
(45) Date of Patent: May 13, 2003

(54) SHEET MATERIAL FIXING DEVICE USING SUCTION HOLES WITH SHUT OFF

(75) Inventor: Takao Ozaki, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/814,946

(22) Filed: Mar. 23, 2001

(65) Prior Publication Data

US 2001/0024014 A1 Sep. 27, 2001

(30) Foreign Application Priority Data

Mar. 23, 2000 (JP) ........................................ 2000-082705

(51) Int. Cl.⁷ ................................................ B65H 5/08
(52) U.S. Cl. ........................................ 271/276; 271/196
(58) Field of Search .......................... 271/276, 196; 101/410

(56) References Cited

U.S. PATENT DOCUMENTS

| | | | | |
|---|---|---|---|---|
| 4,660,825 A | * | 4/1987 | Umezawa | 271/276 |
| 5,383,001 A | * | 1/1995 | Bosy | 101/378 |
| 6,003,442 A | * | 12/1999 | Solomon et al. | 101/409 |
| 6,050,683 A | * | 4/2000 | Nuita et al. | 271/276 |
| 6,348,963 B2 | * | 2/2002 | Fukui | 271/276 |
| 6,357,869 B1 | * | 3/2002 | Rasmussen et al. | 271/196 |
| 6,371,430 B1 | * | 4/2002 | Vernackt | 248/362 |
| 6,435,091 B2 | * | 8/2002 | Halup et al. | 101/415.1 |

* cited by examiner

*Primary Examiner*—Donald P. Walsh
*Assistant Examiner*—Jonathan R Miller
(74) *Attorney, Agent, or Firm*—Sughrue Mion, PLLC

(57) ABSTRACT

A sucking hole is formed at a longitudinal groove at a leading end chuck side end of the longitudinal groove. In a clamp of the leading end chuck, a shut-off valve facing the sucking hole is provided at a clamp portion which opposes a leading end of the printing plate. When the longitudinal groove is not covered with the printing plate, a cap portion of the shut-off valve enters the longitudinal groove so as to shut the sucking hole. In this way, negative pressure is supplied only to the longitudinal groove which is covered with the printing plate, and leakage of negative pressure from the sucking holes of the longitudinal grooves not covered by the printing plate is prevented. As a result, desired suction adhesion can be obtained without need for a large-capacity negative pressure source.

20 Claims, 9 Drawing Sheets

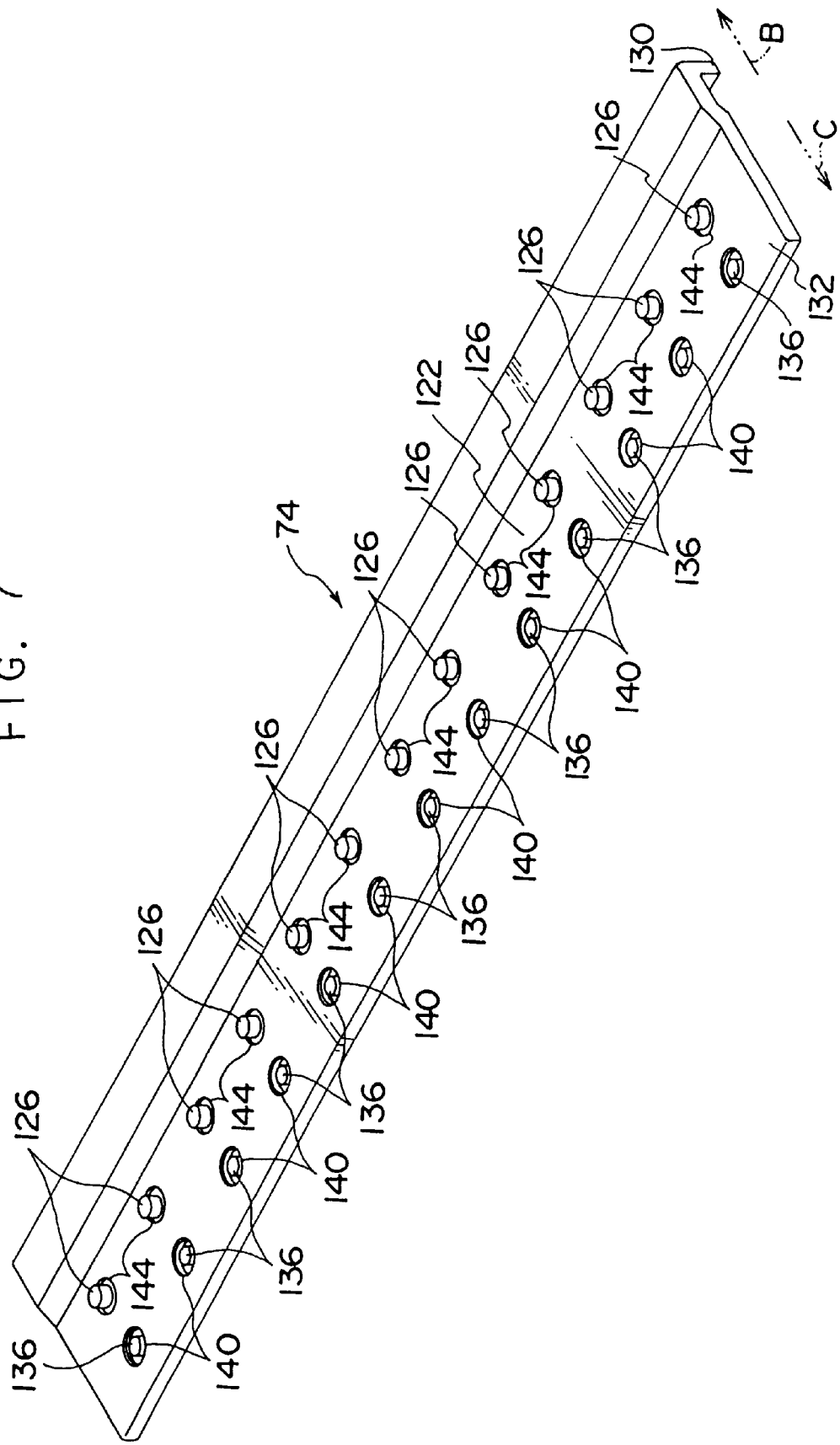

SHEET MATERIAL FIXING DEVICE USING SUCTION HOLES WITH SHUT OFF

BACKGROUND OF THE INVENTION

1. Field of the Invention

The present invention relates to a sheet material fixing device which, together with a rotating drum, nips peripheral end portions of a sheet material wound onto a peripheral surface of the rotating drum, and which sucks and fixes the sheet material onto the peripheral surface of the rotating drum by means of negative pressure supplied to sucking grooves formed in the peripheral surface of the rotating drum.

2. Description of the Related Art

One example of the sheet material is a photosensitive planographic printing plate (hereinafter referred to as a "printing plate") which includes a sheet-like substrate, such as a thin plate of aluminum, and a photosensitive layer formed thereon. The size of the printing plate is selected so as to correspond to the size (i.e., length and width) of a material to be printed.

One type of image exposure apparatus which carries out image exposure on a printing plate is structured such that a printing plate is wound onto a rotating drum and is subjected to scanning exposure while being rotated together with the rotating drum, the scanning exposure being carried out by a light beam corresponding to image data being irradiated onto the printing plate. In such an image exposure apparatus, printing plates of various sizes can be used for image printing as long as they are in a predetermined range of sizes.

In such an image exposure apparatus, a fixing device such as a clamp is disposed at the rotating drum and a peripheral end portion of the printing plate is nipped and fixed between the fixing device and the peripheral surface of the rotating drum so as to prevent positional deviation of the printing plate at the time the printing plate is scanned and exposed. When the rotating drum is rotated at a high speed, problems such as "floating-up" of the printing plate may occur due to centrifugal force. In the image exposure apparatus, grooves are formed in the peripheral surface of the rotating drum and the printing plate is sucked and held by means of negative pressure supplied to these grooves so as to prevent the printing plate from rising up in this manner.

If the printing plate is sucked to and held on the outer peripheral surface of the rotating drum in such a manner that the entire surface of the printing plate is made to closely contact the drum, grooves for sucking the printing plate must be provided at least along the end portions of the printing plate. Further, in order to suck printing plates of various sizes, it is necessary to form a large number of grooves so as to correspond to the printing plates of the respective sizes.

However, in case in which the sucking grooves are formed so that printing plates of various sizes (i.e., printing plates having different lengths or widths) can be sucked by the grooves, when a printing plate having a small length or width is to be sucked, the sucking grooves used for sucking large-sized printing plates are not covered by a printing plate and leakage of negative pressure from such uncovered sucking grooves occurs. As a result, the strength of the suction adhesion of the printing plate is lowered due to this leakage of negative pressure.

One method for reliably sucking the printing plate is to provide a large-capacity vacuum reservoir or an aspirator in consideration of the leakage of negative pressure from the sucking grooves which are not covered by a printing plate. However, employing a larger-capacity negative pressure source such as a vacuum reservoir or an aspirator may lead to increases in the size and cost of the apparatus (e.g., an image exposure apparatus) which is equipped with a rotating drum.

SUMMARY OF THE INVENTION

In view of the aforementioned, an object of the present invention is to provide a sheet material fixing device in which a sheet material such as a printing plate wound on a the rotating drum can be reliably sucked to and fixed onto the rotating drum, without causing an increase in the size and cost of the apparatus.

A device relating to the present invention is a device for sucking a substantially rectangular sheet which is trained around a rotating drum and fixing the sheet onto the drum, comprising: (a) a chuck disposed along an axial direction of the drum so as to oppose a drum circumferential direction end portion of the sheet, said chuck able to press the end portion of the sheet toward the drum when the sheet is fixed onto the drum; (b) a plurality of sucking grooves formed in an outer peripheral surface of the drum at predetermined intervals in the axial direction of the drum and substantially parallel to each other, said sucking grooves extending along a circumferential direction of the drum; (c) a sucking hole formed at each of the sucking grooves; and (d) a shut-off element which is urged in a direction of shutting-off a corresponding sucking hole, and is able to shut-off the corresponding sucking hole when the shut-off element is not covered by the sheet when the sheet is fixed on the drum.

Another device relating to the present invention is a device for sucking a substantially rectangular sheet which is trained around a rotating drum and fixing the sheet onto the drum, comprising: (a) a chuck disposed along an axial direction of the drum so as to oppose a drum circumferential direction end portion of the sheet, said chuck able to press the end portion of the sheet toward the drum when the sheet is fixed onto the drum; (b) a plurality of sucking grooves formed in an outer peripheral surface of the drum at predetermined intervals in the axial direction of the drum and substantially parallel to each other, said sucking grooves extending along a circumferential direction of the drum; and (c) a partitioning element disposed so as to project toward a corresponding sucking groove, and able to engage with the sheet and partition the sucking groove when the sheet is fixed on the drum.

Yet another device relating to the present invention is a device for sucking a substantially rectangular sheet which is trained around a rotating drum and fixing the sheet onto the drum, comprising: (a) a first chuck which is disposed along an axial direction of the drum so as to face one drum circumferential direction end portion of the sheet, and which can press the one end portion of the sheet toward the drum when the sheet is fixed onto the drum; (b) a second chuck which is disposed along an axial direction of the drum so as to oppose another drum circumferential direction end portion of the sheet, and which can press the other end portion of the sheet toward the drum when the sheet is fixed onto the drum; (c) a plurality of sucking grooves formed in an outer peripheral surface of the drum at predetermined intervals in the axial direction of the rotating drum and substantially parallel with each other, said sucking grooves extending along a circumferential direction of the drum; (d) a sucking hole formed at each of the sucking grooves; (e) a sucking device which is connected to the holes and which may supply negative pressure to the sucking grooves; (f) a shut-off element which is formed at the first chuck and is urged in a direction of shutting-off a corresponding sucking hole, and is able to shut the corresponding sucking hole when the shut-off element is not covered by the sheet when the sheet is fixed on the drum; and (g) a partitioning element which is provided at the second chuck so as to project toward a corresponding sucking groove, and is able to engage with the sheet and partition the sucking groove when the sheet is fixed on the drum.

BRIEF DESCRIPTION OF THE DRAWINGS

FIG. 7 is a schematic perspective view showing a trailing end chuck used in the present embodiment.

DESCRIPTION OF THE PREFERRED EMBODIMENTS

Figure 1:
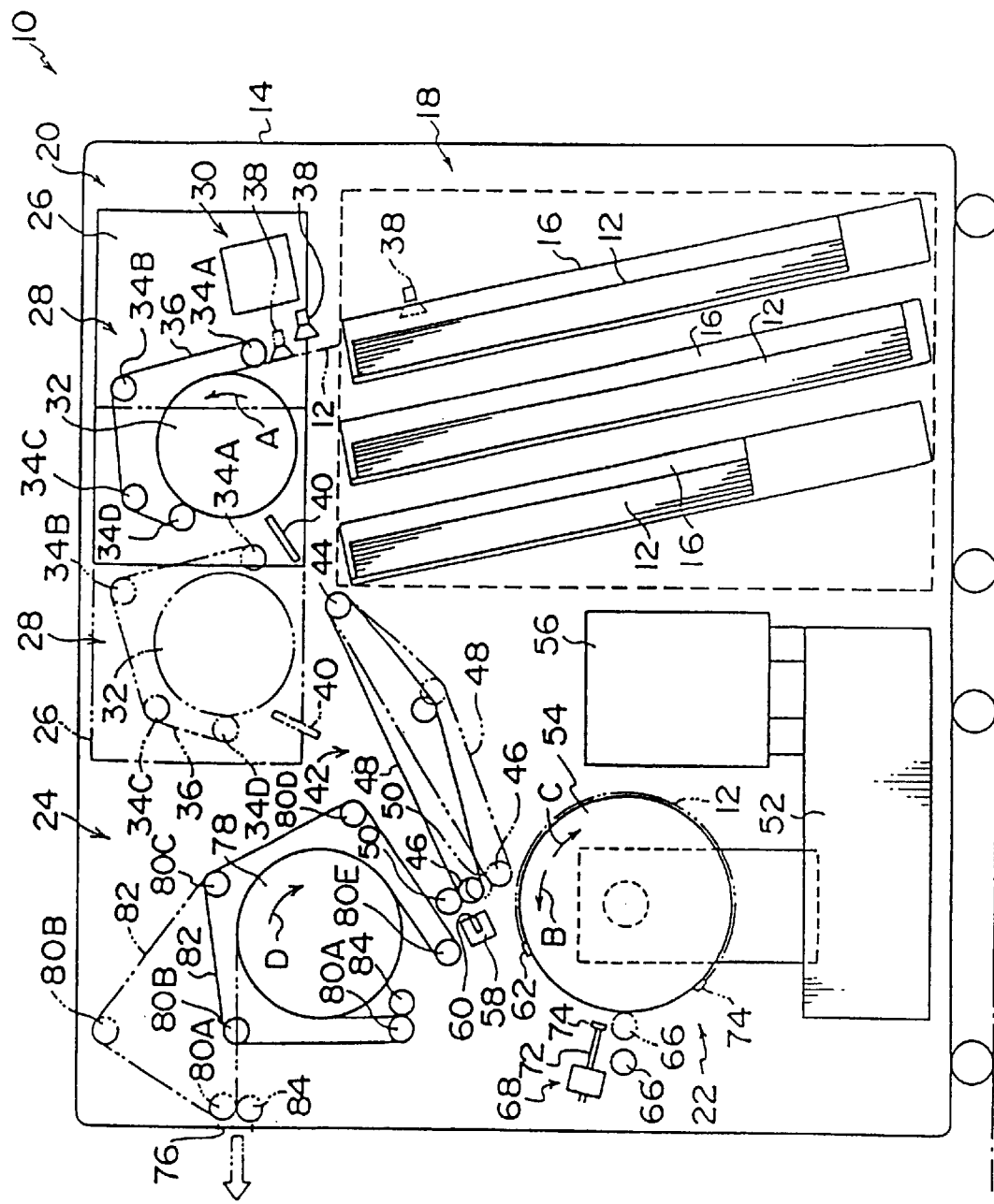
FIG. 1 is a schematic structural diagram showing an image exposure apparatus according to the present invention.

Referring now to the attached drawings, an embodiment of the present invention will be described hereinafter. FIG. 1 shows a schematic structure of an image exposure apparatus 10 used in the present embodiment. The image exposure apparatus 10 carries out scanning exposure by irradiating, onto a sheet material, such as a photosensitive planographic printing plate (hereinafter referred to as a "printing plate 12"), a light beam which is modulated based on image data. The printing plate 12 is formed by a thin, rectangular, plate-shaped substrate of aluminum or the like (for example, a plate having a thickness of about 0.3 mm) and a photosensitive layer formed thereon. The printing plate 12 which has been subjected to image exposure in the image exposure apparatus 10 is then subjected to developing processing and the like in an unillustrated automatic developing apparatus and the like.

As shown in FIG. 1, provided inside a machine frame 14 of the image exposure apparatus 10 are a cassette loading section 18, a plate supplying and conveying section 20, a recording section 22, a discharging buffer section 24, and the like. The cassette loading section 18 is disposed inside the machine frame 14 at the lower right side of FIG. 1. A plurality of cassettes 16 each accommodating a plurality of printing plates 12 are loaded in the cassette loading section 18 so as to be inclined at a predetermined angle.

The printing plate 12 is accommodated in the cassette 16 in such a manner that the photosensitive layer of the printing plate 12 faces up and one end of the printing plate 12 is positioned at a predetermined position. The cassettes 16 are loaded in the cassette loading section 18 at predetermined intervals such that ends of the printing plates 12 are at a predetermined height. Each cassette 16 accommodates printing plats 12 of a single size (length or width), and the respective cassettes 16 contain printing plates 12 of sizes different than those of printing plates 12 accommodated in the other cassettes 16.

The plate supplying and conveying section 20 is disposed above the cassette loading section 18. The recording section 22 is disposed at a lower central portion of the image exposure apparatus 10 and adjacent to the cassette loading section 18. A pair of side plates 26 (only one is shown in FIG. 1) is provided at the plate supplying and conveying section 20. An inverting unit 28 and a sheet unit 30 are mounted to the side plate 26.

An inverting roller 32 having a predetermined external diameter is disposed at the inverting unit 28, and a plurality of small rollers (for example, four small rollers 34A, 34B, 34C and 34D in the present embodiment) are provided around the inverting roller 32. The small rollers 34A through 34D are disposed in such a manner as to range from the cassette loading section 18 side to the recording section 22 side over the inverting roller 32, and an endless conveying belt 36 is trained around these small rollers. Therefore, the conveying belt 36 is trained around approximately one-half of the circumference of the inverting roller 32 between the small rollers 34A and 34D.

The sheet unit 30 includes a plurality of suction cups 38 which suck the upper end portion of the printing plate 12 in the cassette 16. The suction cups 38 are moved downwards so as to face and suck the upper end portion of the printing plate 12 in the cassette 16 which is loaded in the cassette loading section 18. The sheet unit 30 takes the printing plate 12 out from the cassette 16 by moving the suction cups 38, which have sucked the printing plate 12, substantially upwards, and inserts the leading end portion of the printing plate 12 between the inverting roller 32 and the conveying belt 36. In FIG. 1, the movement of the suction cups 38 is schematically shown by a two-dot chain line.

In the inverting unit 28, the inverting roller 32 and the conveying belt 36 rotate in a direction which allows the printing plate 12 to be taken out from the cassette 16 (i.e., in a direction of arrow A in FIG. 1). The printing plate 12 is nipped by the inverting roller 32 and the conveying belt 36 and taken out from the cassette 16, and conveyed in a curved manner along the peripheral surface of the inverting roller 32. While being conveyed, the printing plate 12 is inverted, and the conveying direction thereof is changed. The radius of the inverting roller 32 is determined so that, when the printing plate 12 is curved, no folds and bends arise at the printing plate 12 (for example, the radius is 100 mm or more).

As shown in FIG. 1 by a solid line and two-dot chain line, the side plate 26 moves in a horizontal direction in accordance with the position of the cassette 16 from which the printing plate 12 is taken out. In this way, the suction cups 38 of the sheet unit 30 face the printing plate 12 in the selected cassette 16.

Further, at the side plate 26, a guide 40 is disposed below the small roller 34D. The printing plate 12 which has been inverted by the inverting roller 32 is sent out at the small roller 34D side from between the inverting roller 32 and the conveying belt 36 toward the guide 40.

A conveyor 42 is disposed above the recording section 22. The printing plate 12 which has been sent out from the inverting unit 28 is guided by the guide 40 onto the conveyor 42.

The guide 40 is swung as the side plate 26 moves, so that the guiding direction of the printing plate 12 is directed toward the conveyor 42 at all times. The small roller 34D disposed at the recording section 22 side is moved as the side plate 26 moves, so that the direction in which the printing plate 12 is sent out from the inverting unit 28 is changed. When the small roller 34D moves, the small roller 34C is moved so as to impart a substantially constant tension to the conveying belt 36. The printing plate 12 which is sent out from the inverting unit 28 is thereby curved in a gentle manner by the guide 40.

In the conveyor 42, a conveying belt 48 is trained about a roller 44 disposed below and adjacent to the plate supplying and conveying section 20, and a roller 46 disposed above and adjacent to the recording section 22. The conveying belt 42 is inclined so that the roller 46 side is lower than the roller 44 side.

Figure 2:
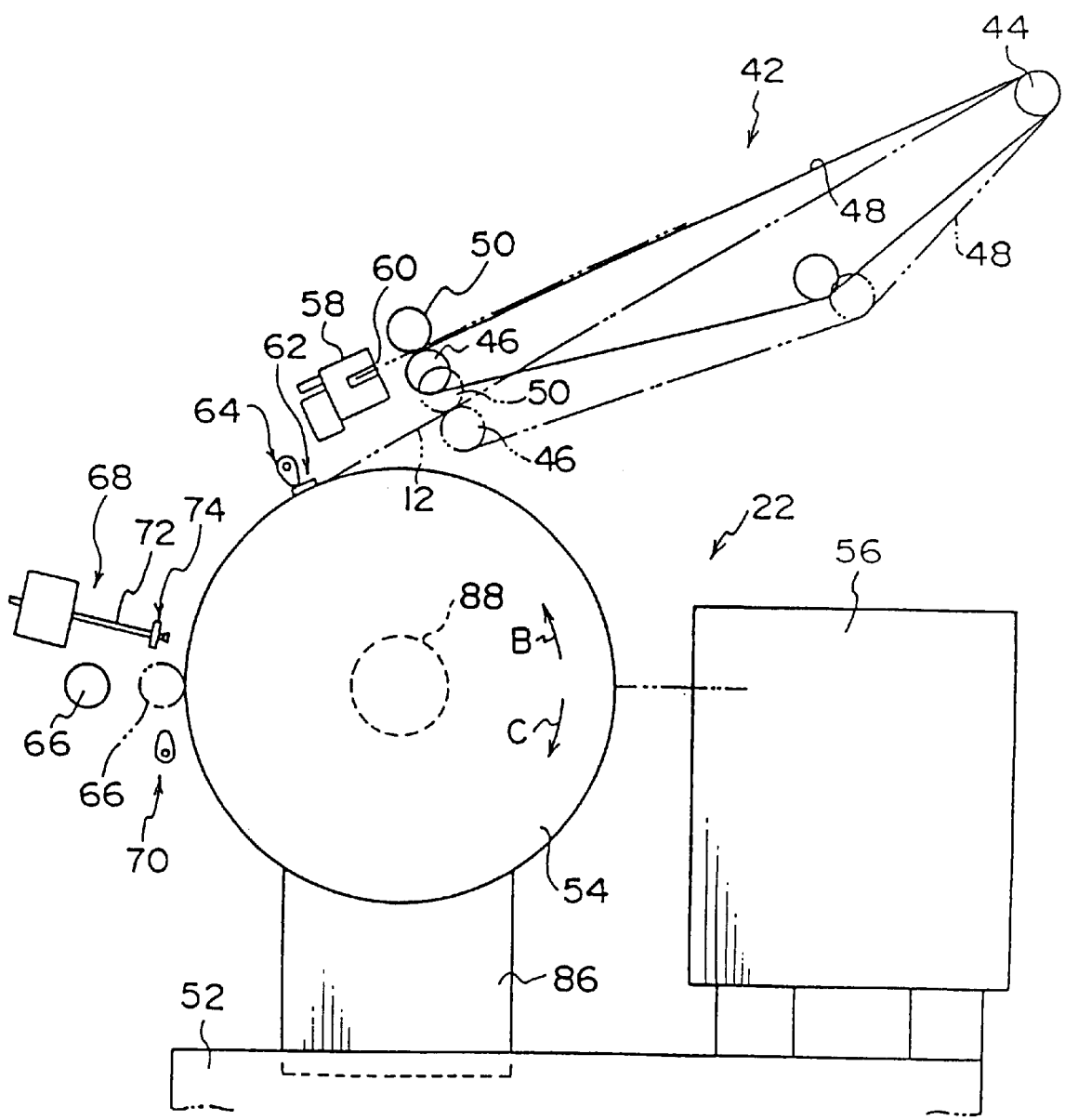
FIG. 2 is a schematic structural diagram showing a recording section provided at the image exposure apparatus.

As shown in FIGS. 1 and 2, in the conveyor 42, the roller 46 and a roller 50 are disposed so as to face each other. The printing plate 12 which has been fed onto the conveyor 42 is conveyed by the conveying belt 48 and is nipped by the rollers 46 and 50 so as to be sent out from the conveyor 42.

In the recording section 22, a rotating drum 54 on which the printing plate 12 is set is disposed on a mount 52. A recording head 56 is disposed adjacent to the rotating drum 54. In the image exposure apparatus 10, a puncher 58 is disposed above the recording section 22 (i.e., above the rotating drum 54).

As shown in FIG. 2, an opening for holding 60 is formed at the puncher 58. The conveyor 42 holds the printing plate 12 in such a manner that the printing plate 12 is nipped by the rollers 46 and 50, and the leading end portion of the printing plate 12 is inserted into the opening for holding 60. When the leading end portion of the printing plate 12 is inserted into the opening for holding 60, the puncher 58 forms, in predetermined positions of the leading end portion of the printing plate 12, notches or the like for positioning. The printing plate 12 is positioned relative to the puncher 58 by, for example, being positioned on the conveyor 42 and sent into the puncher 58. The notch for positioning is formed at a predetermined position of the leading end portion. In the image exposure apparatus 10, the positioning of the printing plate 12 relative to the rotating drum 54 is carried out by inserting an unillustrated pin, which is formed at a predetermined position of the peripheral surface of the rotating drum 54, into the notch formed at the leading end portion of the printing plate 12.

At the conveyor 42, after the notch is formed in the printing plate 12, the leading end portion of the printing plate 12 is pulled out of the opening for holding 60 of the puncher 58 by driving the conveying belt 48 in the opposite direction. Then, the conveyor 42 is moved downwards (as shown in FIGS. 1 and 2 by a two-dot chain line) by an unillustrated swinging means, and the leading end portion of the printing plate 12 is sent out toward a predetermined position of the outer peripheral surface of the rotating drum 54.

Figure 3:
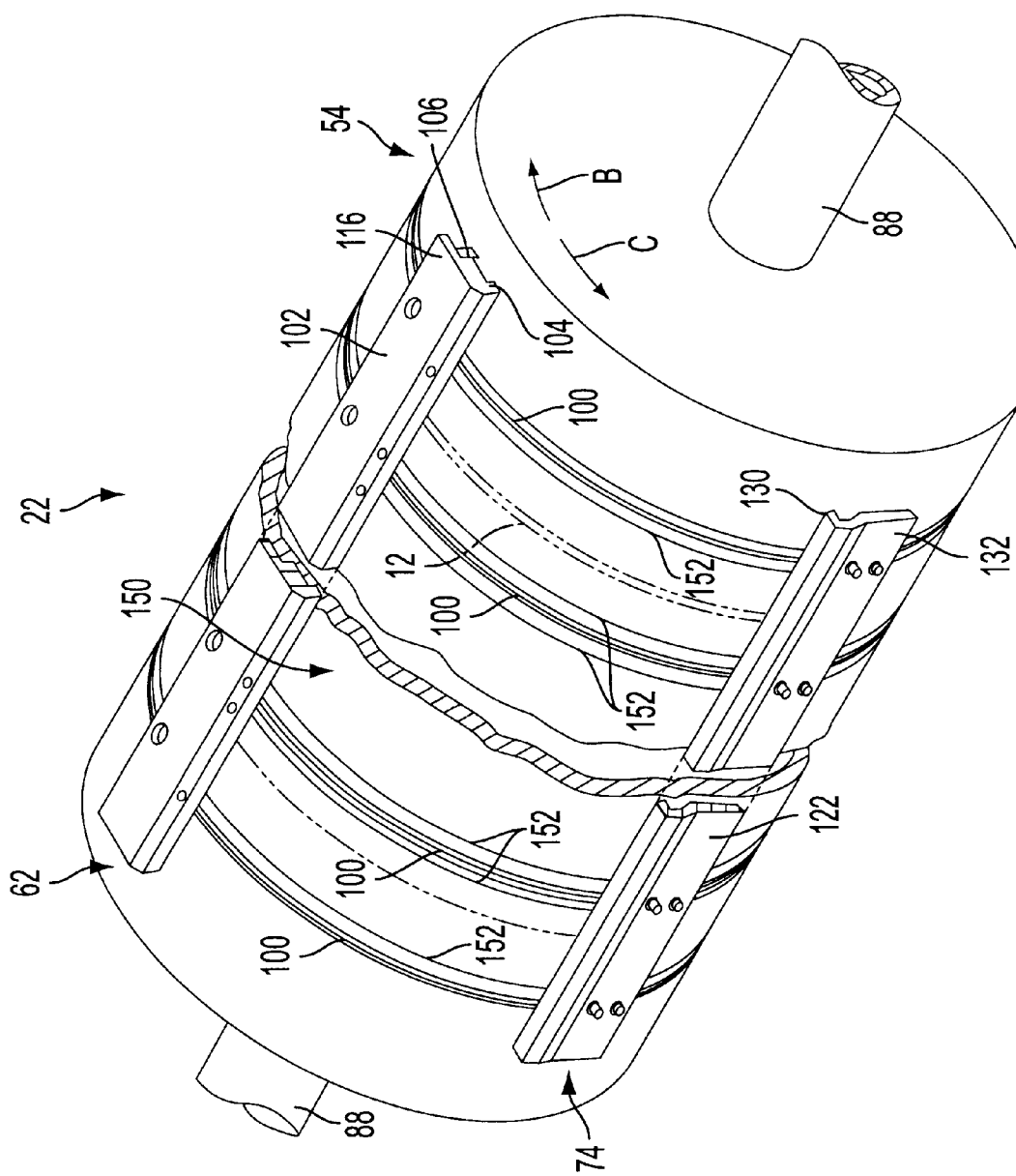
FIG. 3 is a schematic perspective view showing an example of a rotating drum.

As shown in FIG. 3, the rotating drum 54 is provided with a rotation shaft 88. The rotation shaft 88 is supported by a pair of side plates 86 which are disposed so as to stand upright from predetermined positions of the mount 52 as shown in FIG. 2. The rotating drum 54 is rotated, by the driving force from an unillustrated driving means being transmitted to the rotating axis 88, in a direction in which the printing plate 12 is set and exposed (i.e., in the direction of arrow B in FIGS. 1 to 3) and in the opposite direction, i.e., in a direction in which the printing plate 12 is removed from the surface of the rotating drum 54 (i.e., in the direction of arrow C).

As shown in FIG. 2, a leading end chuck 62 which is formed by a first clamp is mounted at a predetermined position of the outer peripheral surface of the rotating drum 54. In the recording section 22, for setting the printing plate 12 on the rotating drum 54 first, the rotating drum 54 is stopped at a position at which the leading end chuck 62 faces the leading end of the printing plate 12 sent in by the conveyor 42 (this position is hereinafter referred to as the "printing plate setting position").

In the recording section 22, a setting cam 64 is disposed which faces the leading end chuck 62 at the printing plate setting position. The printing plate 12 can be inserted between the leading end chuck 62 and the peripheral surface of the rotating drum 54 when the setting cam 64 is rotated so that one end of the setting cam 64 is pressed against the leading end chuck 62. In the recording section 22, the leading end of the printing plate 12 is nipped and held between the leading end chuck 62 and the peripheral surface of the rotating drum 54 by returning the mounting cam 64 to its original position and thereby releasing the pressing thereof against the leading end chuck 62 while the leading end of the printing plate 12 is inserted between the leading end chuck 62 and the rotating drum 54. The printing plate 12 is positioned relative to the rotating drum 54 such that the leading end of the printing plate 12 in a direction in which the printing plate 12 is conveyed is placed along the axial direction of the rotating drum 54.

A squeeze roller 66 is disposed in the vicinity of the peripheral surface of the rotating drum 54 and downstream of the printing plate setting position in the direction in which the rotating drum 54 is rotated so that the printing plate 12 is set and exposed on the rotating drum 54. This squeeze roller 66 is moved toward the rotating drum 54 so that the printing plate 12 which is to be wound onto the rotating drum 54 is pressed toward the rotating drum 54.

In the recording section 22, when the leading end of the printing plate 12 is fixed onto the rotating drum 54, the rotating drum 54 rotates in a direction in which the printing plate 12 is set and exposed so that the printing plate 12 is trained around the rotating drum 54. At this time, the printing plate 12 is pressed against the peripheral surface of the rotating drum 54 by the squeeze roller 66 and is made to closely contact the peripheral surface of the rotating drum 54.

Further, in the recording section 22, a trailing end chuck attaching and detaching unit 68 is disposed in the vicinity of the squeeze roller 66 and at the printing plate setting and exposing direction upstream side thereof. A removing cam 70 is disposed in the vicinity of the squeeze roller 66 and at the printing plate setting and exposing direction downstream side thereof. In the trailing end chuck attaching and detaching unit 68, a trailing end chuck 74 formed by a second clamp is detachably mounted to the distal end of a shaft 72 which projects toward the rotating drum 54.

In the recording section 22, when the trailing end of the printing plate 12 trained on the rotating drum 54 reaches a trailing end chuck attaching and detaching position which faces the trailing end chuck attaching and detaching unit 68, rotation of the rotating drum 54 is temporarily stopped and the trailing end chuck 74 is attached to a predetermined position on the rotating drum 54. As a result, the trailing end of the printing plate 12 trained around the rotating drum 54 is nipped and fixed between the trailing end chuck 74 and the rotating drum 54.

In the recording section 22, when the printing plate 12 is positioned and wound on the rotating drum 54, the squeeze roller 66 is separated from the printing plate 12. Subsequently, in the recording section 22, a light beam which has been modulated on the basis of image data is irradiated from a recording head portion 56 synchronously with the rotation of the rotating drum 54 while the rotating drum 54 is rotated at a predetermined high speed. Then, on the basis of the image data, scanning exposure is carried out on the printing plate 12 so that an image is formed on a predetermined position of the printing plate 12.

In the recording section 22, when the scanning exposure onto the printing plate 12 is completed, the rotating drum 54 is stopped at a position at which the trailing end chuck is attached and detached, and the printing plate 12 is nipped between the squeeze roller 66 and the rotating drum 54. Subsequently, the trailing end chuck 74 is detached from the rotating drum 54 by attaching and detaching unit 68, and the trailing end of the printing plate 12 is released.

In the recording section 22, when the trailing end chuck 74 is detached from the rotating drum 54, the rotating drum 54 is rotated in a direction in which the printing plate 12 is taken out. The printing plate 12 is then sent out from between the squeeze roller 66 and the rotating drum 54.

As shown in FIG. 1, a discharging buffer section 24 is disposed above the squeeze roller 66. Due to rotation of the rotating drum 54 in the printing plate 12 taking-out direction, the printing plate 12 is sent out, from the trailing end thereof, toward the discharging buffer section 24. Further, in the recording section 22, when the rotating drum 54 is rotated in the direction in which the printing plate 12 is taken out and the leading end chuck 62 reaches a printing plate removing position at which the leading end chuck 62 faces the removing cam 70, the rotating drum 54 is stopped and the removing cam 70 is rotated at this position. In this way, the leading end of the printing plate 12 nipped between the leading end chuck 62 and the rotating drum 54 is released and the printing plate 12 is removed from the rotating drum 54.

The discharging buffer section 24 is disposed at an inner side of a discharge port 76 formed in the machine frame 14, and is equipped with a discharging roller 78. A plurality of small rollers (80A, 80B, 80C, 80D and 80E, for example) are disposed around the discharging roller 78, and an endless conveying belt 82 is wound around these small rollers 80A, 80B, 80C, 80D and 80E. Therefore, the conveying belt 82 is wound around approximately ½ to ¾ of the circumference of the discharging roller 78 between the small rollers 80A and 80E.

The small roller 80A is provided so as to project toward the squeeze roller 66 of the recording section 22, and opposes a roller 84. The printing plate 12 sent out from the recording section 22 is guided toward the small roller 80A and the roller 84 and nipped therebetween.

In the discharging buffer section 24, by driving the discharge roller 78 to rotate in a direction in which the printing plate 12 is pulled-in (i.e., in the direction of arrow D), the printing plate 12 nipped between the small roller 80A and the roller 84 is pulled out from the recording section 22 and guided to the nip between the discharge roller 78 and the conveying belt 82. The printing plate 12 is trained around the discharge roller 78 while being nipped between the discharge roller 78 and the conveying belt 82. At this time, in the discharging buffer section 24, rotation of the discharge roller 78 is stopped with the leading end portion (the trailing end side at the time of being sent out from the recording section 22) of the printing plate 12 being nipped between the small roller 80A and the roller 84, and the printing plate 12 trained around the discharge roller 78 is temporarily held in this state.

As shown by a two-dot chain line in FIG. 1, in the discharging buffer section 24, the small roller 80A and the roller 84 move to a position at which they oppose the discharge port 76. At this time, due to the small roller 80A and the roller 84 being moved integrally, the leading end of the printing plate 12 is directed toward the discharge port 76. As the small roller 80A moves, the small roller 80B disposed above the small roller 80A moves while imparting a predetermined tension to the conveying belt 82.

In the discharging buffer section 24, when the leading end of the printing plate 12 is directed toward the discharge port 76, the discharge roller 78 is driven to rotate in a direction in which the printing plate 12 is sent out (in the direction opposite the direction of arrow D) at a rotating speed which corresponds to the speed at which the printing plate 12 is to be conveyed in a processing unit such as an automatic development apparatus which is provided adjacent to the discharge port 76. As a result, the printing plate 12 is sent out from the discharge port 76.

As shown in FIG. 3, a plurality of mounting grooves 100 are formed in the rotating drum 54. The mounting grooves 100 are formed at predetermined intervals in the axial direction of the rotating drum 54, and the direction in which the mounting grooves 100 extend coincides with a circumferential direction of the rotating drum 54. The inside of the mounting groove 100 is, for example, formed so as to have a large width (the groove 100 has a substantially inverted-T configuration when seen in transverse cross section). A fixing piece 128 (shown in FIG. 9) is provided at the trailing end chuck 74. The fixing piece 128 is inserted in the mounting groove 100, and removal thereof is prevented when the fixing piece 128 is rotated by a predetermined amount within the mounting groove 100. In this way, the trailing end chuck 74 can be mounted at any arbitrary position along the circumferential direction of the rotating drum 54. In the recording section 22, the printing plate 12 having any length (size) in the circumferential direction of the rotating drum 54 can be fixed onto the rotating drum 54 by attaching the trailing end chuck 74 in such a manner that it corresponds to the trailing end portion of the printing plate 12.

Figure 4:
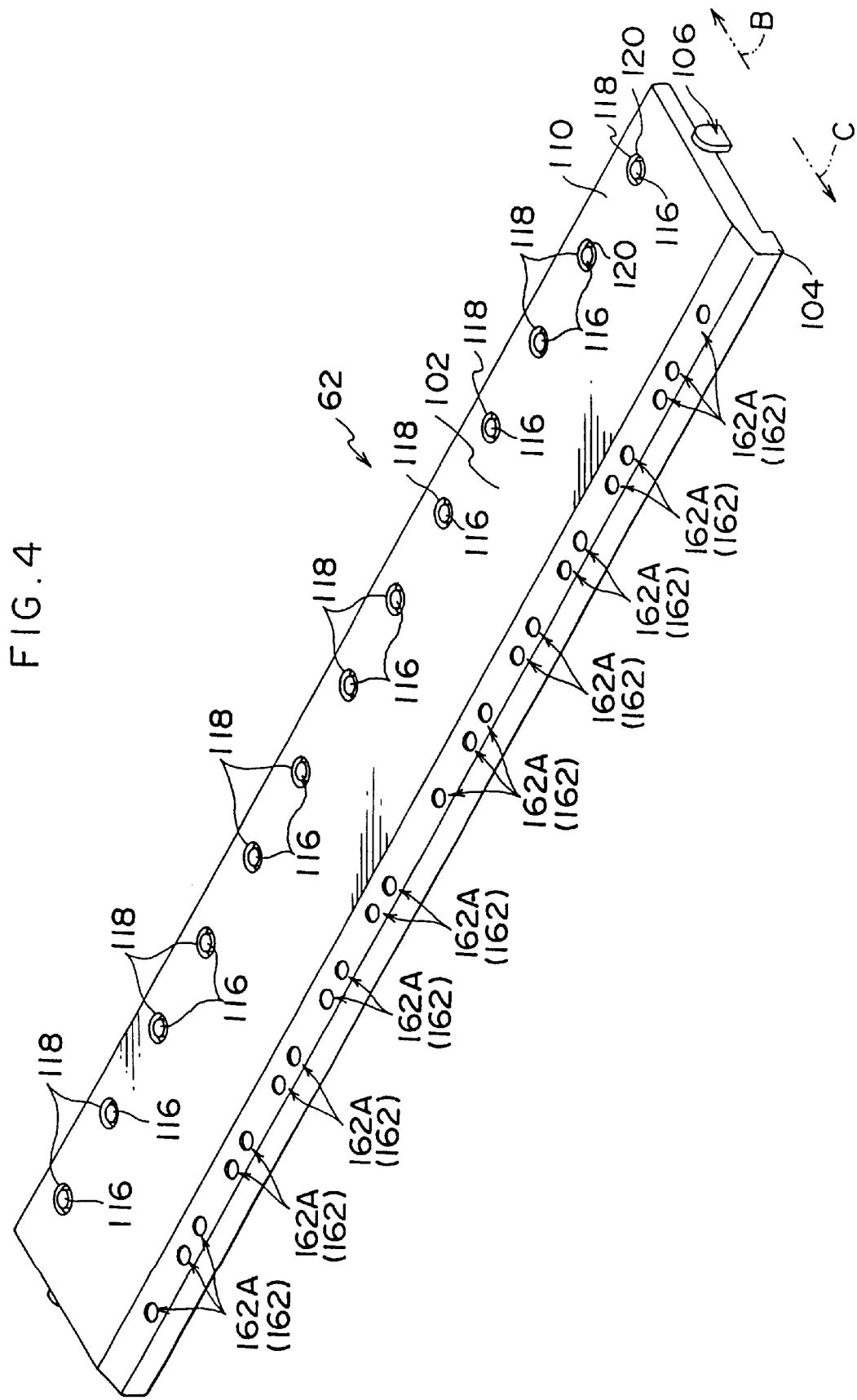
FIG. 4 is a schematic perspective view showing a leading end chuck used in the present embodiment.

As shown in FIGS. 3 and 4, the leading end chuck 62 has a band-plate-shaped clamp 102 which is disposed such that the longitudinal direction thereof runs along the axial direction of the rotating drum 54. Accordingly, a printing plate 12 of any size having a transverse dimension within a predetermined range can be set onto the rotating drum 54. Alternatively, a structure in which a plurality of clamps are disposed along the axial direction of the rotating drum 54 can also be used for the leading end chuck 62.

Figure 5:
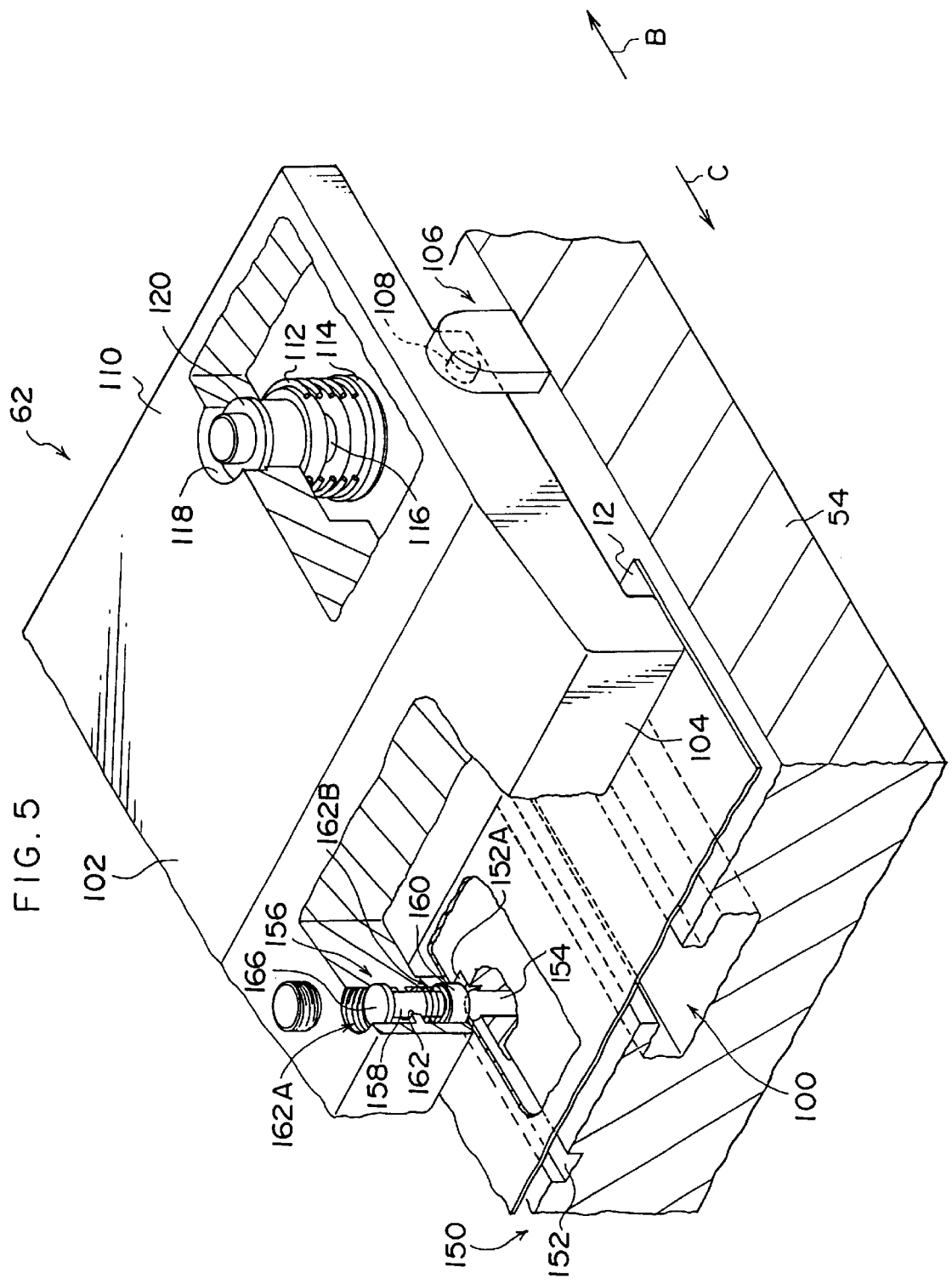
FIG. 5 is a perspective view of main portions, which illustrates a schematic structure of the leading end chuck.
Figure 6A:
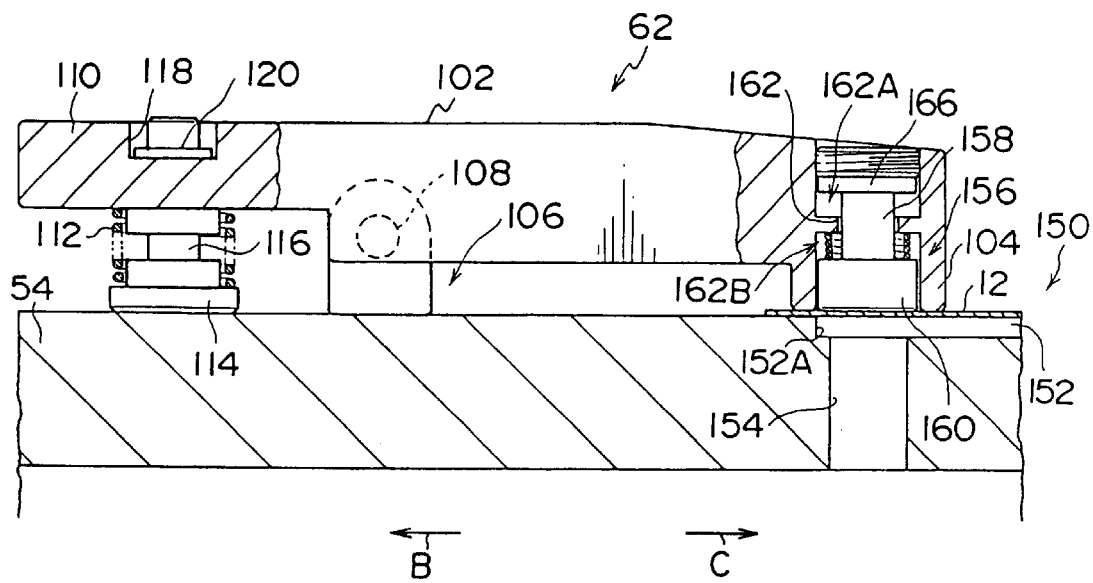
FIG. 6A is a cross-sectional view of main portions, which illustrates a vicinity of a leading end chuck side end portion of a longitudinal groove, showing a state in which the longitudinal groove is covered by a printing plate.

As shown in FIGS. 4, 5, 6A and 6B, one end of the clamp 102 of the leading end chuck 62 in the transverse direction serves as a clamp portion 104. As shown in FIGS. 5 and 6A, the leading end portion of the printing plate 12 is inserted and nipped between the clamp 104 and the circumferential surface of the rotating drum 54.

A leg portion 106 is provided at the clamp 102 at a transverse direction central portion thereof. The clamp 102 is mounted to a predetermined position of the rotating drum 54 by fixing the leg portion 106 onto the rotating drum 54. The clamp 102 can swing with a supporting shaft 108 provided at the leg portion 106 serving as an axis. However, the swing mechanism of the clamp 102 is not limited to this mechanism.

The other end of the clamp 102, at the other side of the supporting shaft 108 serves as a presser portion 110. A coil spring 112 is provided at the rotating drum 54 side of the presser portion 110. In the presser portion 110 of the clamp 102, a shaft 116 having an abutment plate 114 disposed at one end thereof is inserted into a through hole 118, and a coil spring 112 is interposed between the abutment plate 114 and the presser portion 110. The through hole 118 has a larger diameter at the side opposite to the rotating drum 54 side thereof. A flange portion 120 is provided at an end portion of the shaft 116 opposite to the abutment plate 114 side thereof. The flange portion 120 which enters the large diameter portion of the through hole 118 serves to prevent the shaft 116 from coming out from the presser portion 110.

Due to the abutment plate 114 abutting against the peripheral surface of the rotating drum 54, the coil spring 112 urges the presser portion 110 in a direction in which it is separated from the peripheral surface of the rotating drum 54. Accordingly, at the clamp 102, the clamp portion 104 is urged toward the rotating drum 54, and due to this urging force, nipping force is applied for nipping the printing plate 12 between the clamp portion 104 and the rotating drum 54.

At the clamp 102, the presser portion 110 faces the setting cam 64 and the removing cam 70 (both are shown in FIG. 2). By the presser portion 110 being pressed by the setting cam 64 or the removing cam 70, the clamp 102 is swung against the urging force of the coil spring 112 so that the clamp portion 104 separates from the peripheral surface of the rotating drum 54 (illustration thereof is omitted). As a result, in the recording section 22, the printing plate 12 can be inserted and taken out from between the clamp portion 104 and the peripheral surface of the rotating drum 54.

As shown in FIGS. 3 and 7, the trailing end chuck 74 has a substantially band-plate-shaped clamp 122 which is disposed so that the longitudinal direction thereof runs along the axial direction of the rotating drum 54. However, a structure in which a plurality of clamps are disposed along the axial direction of the rotating drum 54 can also be used for the trailing end chuck 74.

Figure 8:
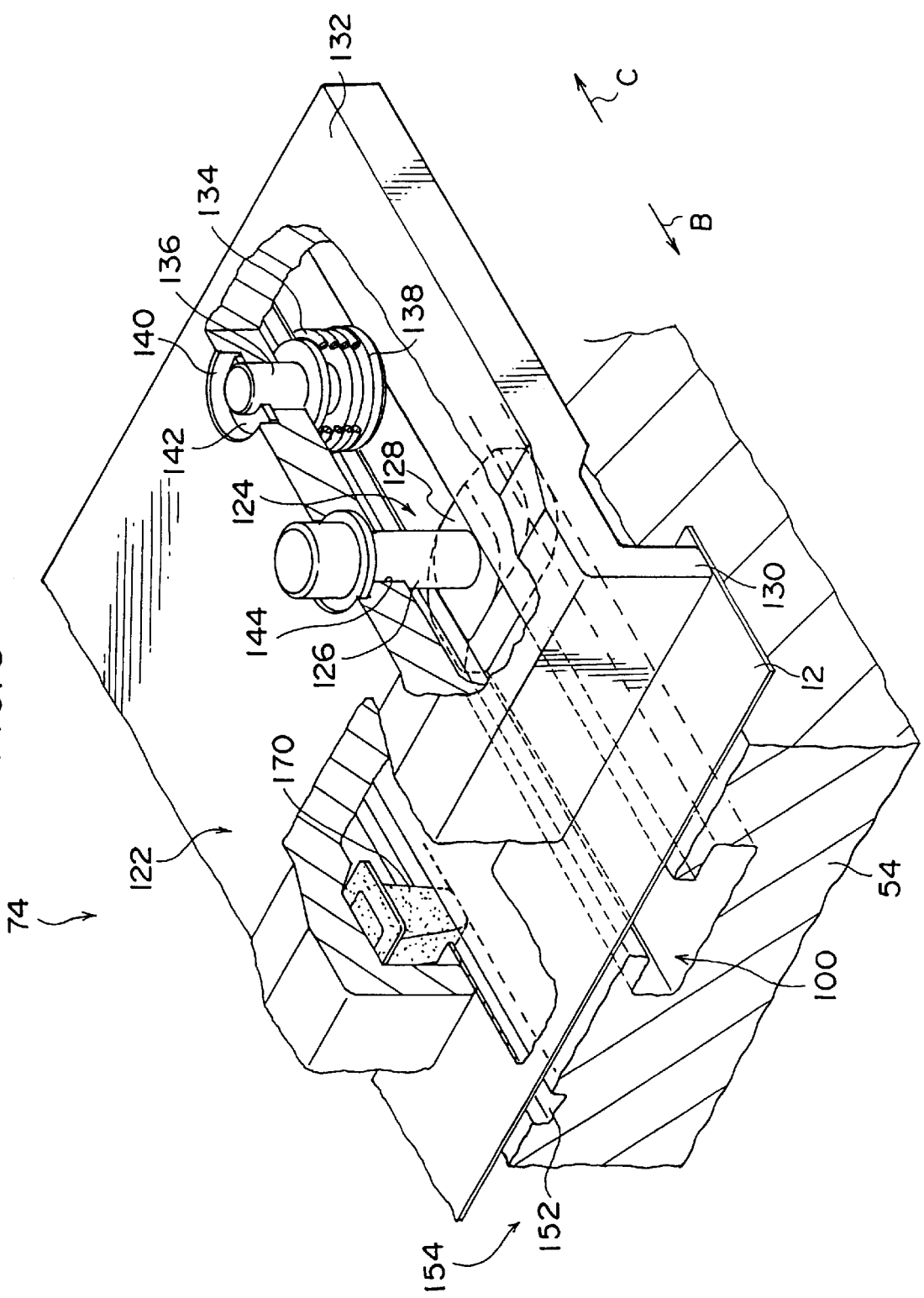
FIG. 8 is a perspective view of main portions, wchih illustrates a schematic structure of the trailing end chuck.
Figure 9:
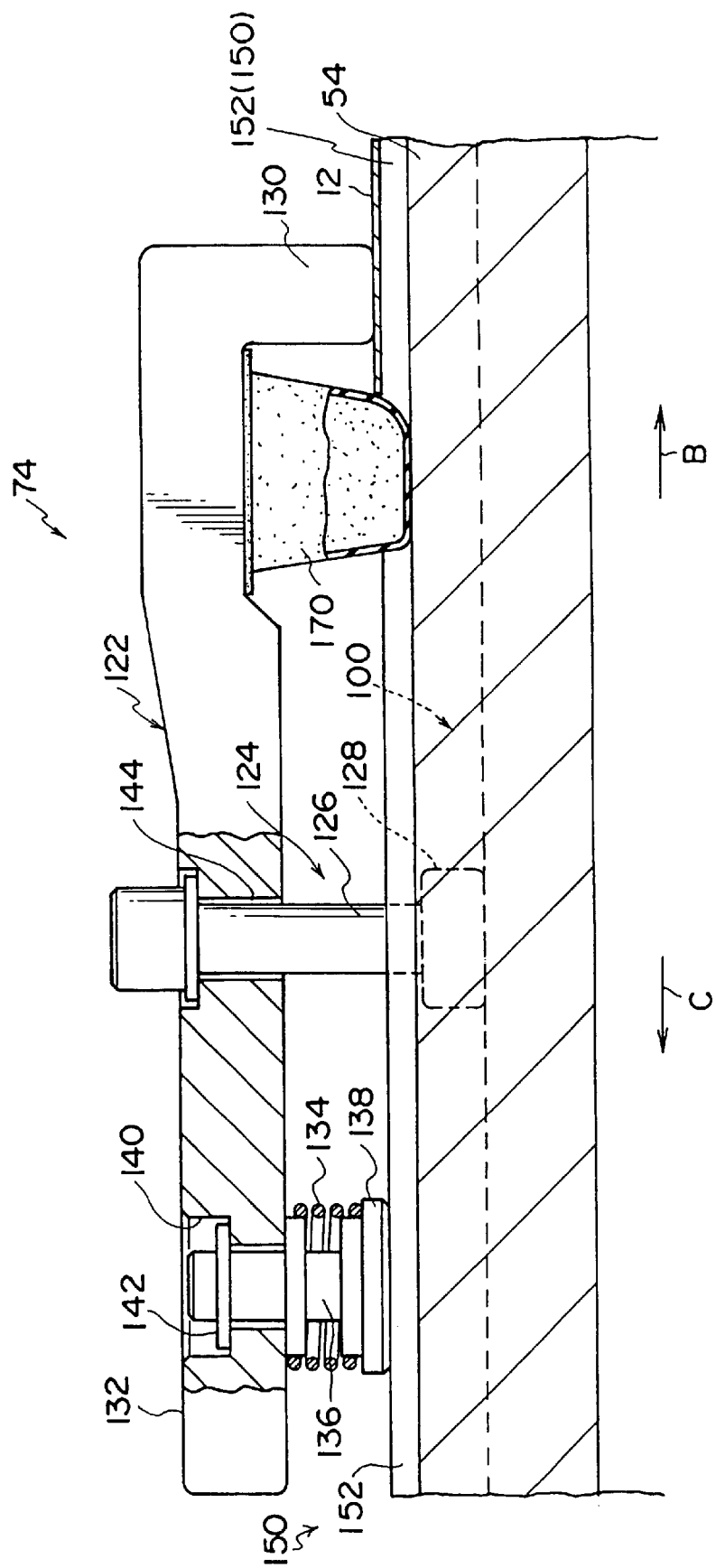
FIG. 9 is a cross-sectional view of main portions, which illustrates a vicinity of the trailing end portion of the printing plate which faces the trailing end chuck.

As shown in FIGS. 8 and 9, leg portions 124 are provided at the clamp 122. The leg portions 124 face the respective mounting grooves 100 formed in the peripheral surface of the rotating drum 54 (shown in FIG. 3). At the leg portion 124, a fixing piece 128 is provided integrally with a supporting leg 126. The supporting leg 126 is assembled to the clamp 122 in such a manner as to be inserted into a through hole 144 formed in the clamp 122 at the transverse direction central portion thereof. The clamp 122 is mounted onto the rotating drum 54 by inserting the fixing pieces 128 into the mounting grooves 100 and rotating the fixing pieces 128 in the groove 100.

As shown in FIGS. 7 to 9, one end of the clamp 122 in the transverse direction thereof serves as a clamp portion 130 which, together with the rotating drum 54, nips the trailing end portion of the printing plate 12. The other transverse direction end of the clamp 122 serves as a presser portion 132. The clamp 122 is disposed such that the clamp portion 130 faces toward the downstream side in the direction in which the printing plate 12 is set and exposed.

In the recording section 22, the trailing end portion of the printing plate 12 can be nipped between the clamp portion 130 and the peripheral surface of the rotating drum 54 by mounting the clamp 122 onto the rotating drum 54 at a position at which the clamp portion 130 opposes the trailing end portion of the printing plate 12 wound on the rotating drum 54.

As shown in FIGS. 8 and 9, a coil spring 134 is provided at the presser portion 132 of the clamp 122. The coil spring 134 is provided in such a manner as to be interposed between an abutment plate 138, which is provided at one end of a shaft 136, and the presser portion 132. The coil spring 134 is mounted in such a manner that the other end of the shaft 136 is inserted into a through hole 140 formed in the presser portion 132. A flange portion 142 is provided on the shaft 136 and serves to prevent the shaft 136 from being coming out from the through hole 140.

When the trailing end chuck 74 is to be mounted, the trailing end chuck 74 is mounted onto the rotating drum 54 by disposing the clamp 122 such that it corresponds to the trailing end of the printing plate 12, then inserting the fixing pieces 128 into the mounting grooves 100 and rotating the fixing pieces 128 by a predetermined amount to fix them. At this time, the abutment plate 138 abuts against the rotating drum 54 and urges the presser portion 132 to separate from the rotating drum 54. As a result, the printing plate 12 is nipped between the clamp portion 130 and the rotating drum 54.

As shown in FIG. 3, one side of the rotating shaft 88 of the rotating drum 54 is formed as a pipe. Negative pressure for sucking the printing plate 12 is supplied from an unillustrated aspirator or a negative pressure source such as a vacuum reservoir into the hollow portion inside the rotating drum 54 through the pipe-shaped rotating shaft 88. Conventional structures can be used as the negative pressure source and the connecting means connecting the rotating drum 54 and negative pressure source, and detailed description thereof is omitted.

A group 150 of sucking grooves are formed at the outer peripheral surface of the rotating drum 54. The group 150 of sucking grooves is made up of a plurality of longitudinal grooves 152 which are disposed between the mounting grooves 100 so that the longitudinal direction thereof runs along the circumferential direction of the rotating drum 54. The distance between the longitudinal grooves 152 is set so that at least one longitudinal groove 152 is present at inner sides of the longitudinal edges of the printing plate 12 when a printing plate 12 of any size is placed on the peripheral surface of the rotating drum 54.

That is, when the printing plate 12 is trained onto the peripheral surface of the rotating drum 54, at least one longitudinal groove 152 is always present at inner sides of the longitudinal edges of the printing plate 12.

Figure 6B:
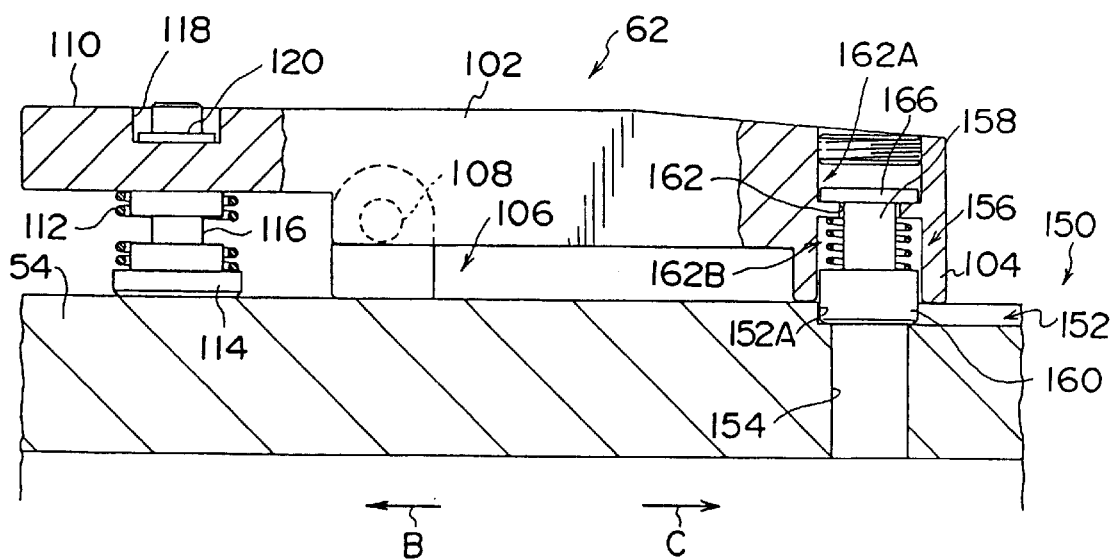
FIG. 6B is a cross-sectional view of main portions of vicinities, which illustrates a vincinity of a leading end chuck side end portion of a longitudinal groove, showing a state in which the longitudinal groove is not covered by a the printing plate.

As shown in FIGS. 6A and 6B, one end portion 152A of the longitudinal groove 152 reaches the vicinity of the leading end chuck 62. Accordingly, as shown in FIG. 6A, the end portion 152A of the longitudinal groove 152 is also covered with the printing plate 12 when the printing plate 12 is wound onto a predetermined position of the rotating drum 54.

As shown in FIGS. 5, 6A and 6B, a sucking hole 154 which communicates with the interior of the rotating drum 54 is formed in the vicinity of the end portion 152A of the longitudinal groove 152. The negative pressure supplied to the rotating drum 54 is supplied to each of the longitudinal grooves 152 via the sucking holes 154. That is, the sucking holes 154 are connected to the unillustrated negative pressure source.

Shut-off valves 156 are provided at the clamp 102 of the leading end chuck 62 in such a manner as to respectively face the sucking holes 154 provided at the plurality of longitudinal grooves 152.

In the shut-off valve 156, a cap portion 160 facing the sucking hole 154 is provided at one end of a shaft 158. A through hole 162 is formed in the clamp portion 104 of the clamp 102. An end of the shaft 158, which end is opposite to the cap portion 160 side, is inserted into the through hole 162.

Large diameter portions 162A and 162B are formed at the through hole 162. A flange portion 166, which has an outer diameter corresponding to an inner diameter of the large diameter portion 162A, is formed at the shaft 158. The flange portion 166 is disposed in the large diameter portion 162A and serves to prevent the shaft 158 from coming out from the through hole 162.

The shut-off valve 156 includes a coil spring 168 disposed between the cap portion 160 and the clamp 102, and the cap portion 160 is urged toward the sucking hole 154 by the urging force of the coil spring 168.

In the thus structured shut-off valve 156, the cap portion 160 is moved so as to be separated from the sucking hole 154 by swinging the clamp 102 in the direction in which the clamp portion 104 separates from the peripheral surface of the rotating drum 54 (illustration thereof is omitted).

As shown in FIG. 6A, in the shut-off valve 156, when the leading end chuck 62 nips the leading end portion of the printing plate 12 between the clamp portion 104 and the peripheral surface of the rotating drum 54, the end portion 152A of the longitudinal groove 152 is covered by the printing plate 12, and the cap portion 160 thereby abuts against the upper surface of the printing plate 12. As shown in FIG. 6B, when the printing plate 12 is separated from the end portion 152A of the longitudinal groove 152, the cap portion 160 is urged toward the bottom surface of the longitudinal groove 152 by the urging force of the coil spring 162 and shuts off the sucking hole 154. In this manner, negative pressure is supplied via the sucking hole 154 to the longitudinal groove 152 covered with the printing plate 12. On the other hand, since the sucking hole 154 is shut, no negative pressure is supplied to the longitudinal groove 152 which is not covered by the printing plate 12.

It is preferable that an elastic member made of rubber for example is provided at least at the rotating drum 54 side of the cap portion 160, and that the elastic member undergoes elastic deformation when it abuts against the bottom surface of the longitudinal groove 152, so as to tightly close the sucking hole 154. The coil spring 168 is accommodated in the large diameter portion 162B of the through hole 162, and the cap portion 160 also enters the large diameter portion 162B when the cap portion 160 abuts against the printing plate 12.

As shown in FIGS. 8 and 9, protruding portions 170 serving as second shut-off means are provided at the trailing end chuck 74. Each protruding portion 170 is disposed between the leg portion 124 and the clamp portion 130 so as to face the respective longitudinal groove 152.

As shown in FIG. 9, the protruding portion 170 is formed of an elastic member such as rubber, and the outer configuration of the protruding portion 170 is a rectangular block shape which corresponds to the cross-sectional configuration of the longitudinal groove 152. The protruding portion 170 has a hollow interior which is filled with air of a predetermined pressure.

Accordingly, when the clamp 122 is mounted onto the rotating drum 54, the protruding portion 170 enters the longitudinal groove 152 and undergoes elastic deformation so as to conform to the inner surfaces and the bottom surface of the longitudinal groove 152. In this way, the ends of the longitudinal groove 152 which ends run along the circumferential direction of the rotating drum 54 are blocked by the protruding portion 170.

The clamp portion 130 of the trailing end chuck 74 faces the trailing end portion of the printing plate 12 so that the protruding portion 170 faces the trailing end edge of the printing plate 12. Accordingly, by mounting the trailing end chuck 74 to the rotating drum 54 at a predetermined position facing the trailing end of the printing plate 12, both a region of the longitudinal groove 152 which is covered with the printing plate 12 and a region of the longitudinal groove 152 which is not covered with the printing plate 12 are blocked by the protruding portion 170. Therefore, the region which is covered with the printing plate 12 is tightly sealed so that leakage of negative pressure is prevented.

Operation of the present embodiment will now be described.

In the image exposure apparatus 10, image data to be recorded on the printing plate 12 by exposure is inputted, and the size and the number of the printing plates 12 which are to be subjected to image exposure are set. Subsequently, an instruction is given to start image exposure, and then image exposure is started. An operation panel may be provided at the image exposure apparatus 10 so that the instruction to start processing can be given by operating a switch of the operation panel. Or, starting of processing in the image exposure apparatus 10 may be instructed by signals from an image processing apparatus or the like which outputs image data to the image exposure apparatus 10.

In the image exposure apparatus 10, when starting of processing is instructed, the printing plates 12 of the specified size are taken out one at a time from the cassette 16, placed on the conveyor 42, and fed to the recording section 22. At this time, the notches for positioning are formed in the leading end of the printing plate 12 by the puncher 58.

In the recording section 22, after being conveyed by the conveyor 42 and wound onto the predetermined position of the rotating drum 54, the printing plate 12 is subjected to scanning exposure by being irradiated with a light beam which is emitted from the recording head portion 56 and which is modulated based on image data, while the rotating drum 54 is rotated at a high rotating speed. In this manner, in the recording section 22, a predetermined image is recorded on the printing plate 12.

In the recording section 22, after an image is formed on the printing plate 12 by scanning exposure, the printing plate 12 is sent out, with the trailing end side thereof being fed out first, toward the discharging buffer section 24. In the discharging buffer section 24, after the printing plate 12 which is fed from the recording section 22 is trained onto the discharge roller 78, the leading end of the printing plate 12 is directed toward the discharge port 76. As a result, the printing plate 12 on which an image has been formed is sent out from the discharge port 76.

In the recording section 22, when the printing plate 12 is wound onto the rotating drum 54, the leading end portion of the printing plate 12 is nipped and fixed between the leading end chuck 62 and the rotating drum 54, and the trailing end portion is nipped and fixed between the trailing end chuck 74 and the rotating drum 54. At the same time, in the recording section 22, the printing plate 12 is sucked by negative pressure supplied to the longitudinal grooves 152 of the group 150 of sucking grooves formed in the rotating drum 54. At this time, negative pressure is supplied to the longitudinal grooves 152 via the sucking holes 154 respectively formed at the longitudinal grooves 152.

When the one end portion 152A of the longitudinal groove 152 along the circumferential direction of the rotating drum 54 reaches the vicinity of the mounting position of the clamp 102 which forms the leading end chuck 62 and the printing plate 12 is wound onto the rotating drum 54, the end portion 152A of the longitudinal groove 152 is covered by the printing plate 12 which is placed on the longitudinal groove 152. The sucking hole 154 is formed in a vicinity of the end portion 152A of the longitudinal groove 152 and is also covered with the printing plate 12.

In the clamp 102 forming the leading end chuck 62, the shut-off valve 158 is provided so as to face the sucking hole 154 of the longitudinal groove 152. The cap portion 160 of the shut-off valve 158 abuts against the surface of the printing plate 12 when the sucking hole 154 is covered by the printing plate 12. Accordingly, the sucking hole 154 of the longitudinal groove 152 covered by the printing plate 12 is open below the printing plate 12 (see FIG. 6A).

At the longitudinal groove 152 which is not covered with the printing plate 12, when the printing plate 12 is nipped between the clamp portion 104 and the rotating drum 54, the cap portion 160 of the shut-off valve 158 enters the longitudinal groove 152 so as to cover the sucking hole 154 (see FIG. 6B). At this time, the cap portion 160 is urged by the urging force of the coil spring 168 toward the peripheral portion of the sucking hole 154. In this way, the sucking hole 154 which is not covered with the printing plate 12 is shut by the cap portion 160.

At the clamp 122 forming the trailing end chuck 74, the protruding portions 170 are provided so as to face the corresponding longitudinal grooves 152. The clamp portion 130 of the clamp 122 faces the trailing end portion of the printing plate 12 so that the protruding portions 170 face the trailing end edge of the printing plate 12. Accordingly, when the clamp 122 is mounted onto the rotating drum 54 and the trailing end portion of the printing plate 12 is nipped between the clamp portion 130 and the rotating drum 54, the protruding portions 170 enter the longitudinal grooves 152 at the trailing end edge of the printing plate 12.

Since the protruding portion 170 is made of an elastic material, when it enters the longitudinal groove 152, it undergoes elastic deformation so as to conform to the inner surfaces and the bottom surface of the longitudinal groove 152. Because the protruding portion 170 also abuts against the trailing end of the printing plate 12, in the longitudinal groove 152 facing the vicinity of the trailing end portion of the printing plate 12, both the region covered by the printing plate 12 and the region not covered by the printing plate 12 are blocked by the protruding portion 170.

In the recording section 22, the leading end portion of the printing plate 12 is nipped and fixed between the leading end chuck 62 and the rotating drum 54, and the trailing end portion is nipped and fixed between the trailing end chuck 74 and the rotating drum 54. At this time, negative pressure is supplied to the rotating drum 54 while the printing plate 12 is squeezed by the squeeze roller 66 so as to tightly contact the peripheral surface of the rotating drum 54.

At this time, because the sucking hole 154 of the longitudinal groove 152 which is not covered with the printing plate 12 is shut by the shut-off valve 156 provided at the clamp 102, leakage of negative pressure from the sucking hole 154 of the longitudinal groove 152 not covered by the printing plate 12 is prevented so that negative pressure is supplied only to the longitudinal groove 152 which is covered by the printing plate 12. Each of the longitudinal grooves 152 into which negative pressure is supplied via the sucking hole 154 is shut at the printing plate 12 trailing end side thereof by the protruding portion 170 provided at the clamp 122 forming the trailing end chuck 74.

Accordingly, in the rotating drum 54, negative pressure is supplied only to the longitudinal grooves 152 which are covered with the printing plate 12, and the rotating drum 54 sucks and holds the printing plate 12 by means of negative pressure. At this time, since leakage of negative pressure is prevented, the printing plate 12 is reliably sucked and held by the rotating drum 54 without deterioration in the suction adhesion of the printing plate 12 due to leakage of negative pressure.

In the rotating drum 54, the sucking hole 154 is formed in the vicinity of the end portion 152A of the longitudinal groove 152 which faces the clamp 102 of the leading end chuck 62, and the shut-off valve 156 is provided at the clamp 102. The sucking hole 154 which is not covered by the printing plate 12 is shut by the shut-off valve 156. In this manner, leakage of negative pressure from the sucking hole 154 which is not covered by the printing plate 12 is reliably prevented.

The protruding portion 170 is provided at the clamp 122 of the trailing end chuck 74 which is mounted onto the rotating drum 54 so as to face the trailing end portion of the printing plate 12. The protruding portion 170 serves to, at the trailing end edge of the printing plate 12, block the longitudinal groove 152 which is covered by the printing plate 12. Therefore, the protruding portion 170 tightly blocks the longitudinal groove 152 between the end portion 152A and the protruding portion 170, and prevents leakage of negative pressure from the longitudinal groove 152 covered by the printing plate 12.

As a result, the printing plate 12, whose leading end is nipped and fixed between the leading end chuck 62 and the rotating drum 54 and whose trailing end is nipped and fixed between the trailing end chuck 74 and the rotating drum 54, tightly contacts the peripheral surface of the rotating drum 54 by means of negative pressure supplied to the longitudinal grooves 152. Even if the rotating drum 54 rotates at a high speed, positional offset or floating up of the printing plate 12 is not caused. Accordingly, in the recording section 22, an image of high quality can be formed at a proper position of the printing plate 12 regardless of the size of the printing plate 12.

Moreover, in the recording section 22, because leakage of negative pressure from the rotating drum 54 is prevented regardless of the size of printing plate 12, the printing plate 12 can be reliably sucked and held onto the rotating drum 54 without requiring a large-capacity negative pressure source such as a vacuum reservoir or an aspirator in consideration of leakage of negative pressure from the group 150 of sucking grooves. Therefore, in the image exposure apparatus 10, since there is no need to use a large-capacity vacuum reservoir or an aspirator in the recording section 22, the apparatus can be made smaller and can be manufactured at a lower cost.

The present embodiment which has been heretofore described is merely an example of the invention, and therefore is not intended to limit the structure of the present invention. For example, for a first shut-off means provided at the clamp 102 of the leading end chuck 62, any structure can be used instead of the shut-off valve 156 as long as it is able to reliably shut the sucking holes which are not covered by the printing plate 12. For a second shut-off means provided at the clamp 122 of the trailing end chuck 74, any structure can be used instead of the protruding portion 170 as long as it can block the sucking grooves such as the longitudinal grooves 152 covered with the printing plate 12.

Further, in the present embodiment, only the longitudinal grooves 152 are formed as the group 150 of sucking grooves. However, in addition to the longitudinal grooves 152, transverse grooves connecting the longitudinal grooves 152 adjacent to each other can be formed. In this case, it is sufficient that the transverse grooves are disposed so as to be prevented from intersecting the outer end of the printing plate 12 when a printing plate 12 of any size is wound onto the rotating drum 54.

Further, although the printing plate 12 is used as a sheet material in the present embodiment, the sheet material is not limited to the printing plate 12. The present invention can be used to fix any sheet materials such as photosensitive materials including printing papers and films. That is, the present invention can be used not only in the image exposure apparatus 10 in which the rotating drum 54 is provided, but can also be used in an apparatus in which a variety of sheet materials are wound onto a peripheral surface of a rotating drum and tightly fixed thereon.

As described above, in accordance with the present invention, when the both rotating-drum-circumferential-direction ends of the sheet material wound onto the peripheral surface of the rotating drum are nipped and fixed, and the sheet material is sucked and held by negative pressure supplied to the sucking groove covered with the sheet material, because leakage of negative pressure from the sucking groove not covered with the sheet material and from the sucking groove covered with the sheet material can be prevented, sheet materials of any size can reliably be sucked and held on the rotating drum without using a large-capacity vacuum reservoir or aspirator. Further, in the present invention, since leakage of negative pressure is prevented by a first and a second shut-off means, a large-capacity vacuum reservoir or an aspirator are not required in consideration of leakage of negative pressure from the sucking grooves not covered with the sheet material. As a result, there can be obtained the excellent effect that the apparatus in which the rotating drum is provided does not become large.

What is claimed is:

1. A device for sucking a substantially rectangular sheet which is trained around a rotating drum and fixing the sheet onto the drum, comprising:
    (a) a chuck disposed along an axial direction of the drum so as to oppose a drum circumferential direction end portion of the sheet, said chuck able to press the end portion of the sheet toward the drum when the sheet is fixed onto the drum;
    (b) a plurality of sucking grooves formed in an outer peripheral surface of the drum at predetermined intervals in the axial direction of the drum and substantially parallel to each other, said sucking grooves extending along a circumferential direction of the drum;
    (c) a sucking hole formed at each of the sucking grooves; and
    (d) at least one shut-off element which is urged in a direction of shutting-off a corresponding sucking hole, and is able to shut-off the corresponding sucking hole when the shut-off element is not covered by the sheet when the sheet is fixed on the drum.

2. The device of claim 1, wherein the shut-off element is provided at the chuck so as to oppose the corresponding sucking hole.

3. The device of claim 1, wherein each shut-off element includes a cap portion for shutting-off the corresponding sucking hole and an urging member for urging the cap portion.

4. The device of claim 1, further comprising a sucking device which is connected to the sucking hole and supplies negative pressure to the sucking groove.

5. The device of claim 1, wherein the chuck comprises a support which is mounted to the drum, a clamp pivotably supported by the support, and an urging member for urging the clamp to press the sheet against the drum.

6. A device for sucking a substantially rectangular sheet which is trained around a rotating drum and fixing the sheet onto the drum, comprising:
    (a) a chuck disposed along an axial direction of the drum so as to oppose a drum circumferential direction end portion of the sheet, said chuck able to press the end portion of the sheet toward the drum when the sheet is fixed onto the drum;
    (b) a plurality of sucking grooves formed in an outer peripheral surface of the drum at predetermined intervals in the axial direction of the drum and substantially parallel to each other, said sucking grooves extending along a circumferential direction of the drum; and
    (c) a partitioning element disposed so as to project toward a corresponding sucking groove, and able to engage with the sheet and partition the sucking groove when the sheet is fixed on the drum.

7. The device of claim 6, wherein the partitioning element is provided at the chuck so as to oppose the corresponding sucking groove.

8. The device of claim 6, wherein the partitioning element is formed by an elastic member.

9. The device of claim 6, wherein the partitioning element has a shape which is complementary to a shape of the corresponding sucking groove.

10. The device of claim 6, further comprising a sucking hole formed at each of the sucking grooves.

11. The device of claim 10, further comprising a sucking device which is connected to the sucking hole and supplies negative pressure to the sucking groove.

12. The device of claim 6, wherein the chuck comprises a support which is mounted to the drum, a clamp pivotably supported by the support, and an urging member for urging the clamp to press the sheet against the drum.

13. The device of claim 12, further comprising a chuck mounting element via which said support is detachably mounted onto the drum.

14. A device for sucking a substantially rectangular sheet which is trained around a rotating drum and fixing the sheet onto the drum, comprising:
    (a) a first chuck which is disposed along an axial direction of the drum so as to face one drum circumferential direction end portion of the sheet, and which can press the one end portion of the sheet toward the drum when the sheet is fixed onto the drum;
    (b) a second chuck which is disposed along an axial direction of the drum so as to oppose another drum circumferential direction end portion of the sheet, and which can press the other end portion of the sheet toward the drum when the sheet is fixed onto the drum;

(c) a plurality of sucking grooves formed in an outer peripheral surface of the drum at predetermined intervals in the axial direction of the rotating drum and substantially parallel with each other, said sucking grooves extending along a circumferential direction of the drum;

(d) a sucking hole formed at each of the sucking grooves;

(e) a sucking device which is connected to the holes and which may supply negative pressure to the sucking grooves;

(f) a shut-off element which is formed at the first chuck and is urged in a direction of shutting-off a corresponding sucking hole, and is able to shut the corresponding sucking hole when the shut-off element is not covered by the sheet when the sheet is fixed on the drum; and (g) a partitioning element which is provided at the second chuck so as to project toward a corresponding sucking groove, and is able to engage with the sheet and partition the sucking groove when the sheet is fixed on the drum.

15. The device of claim 14, wherein the first chuck comprises a support which is mounted to the drum, a clamp pivotably supported by the support, and an urging member for urging the clamp to press the sheet against the drum.

16. The device of claim 14, wherein the shut-off element includes a cap portion for shutting the corresponding sucking hole, and an urging member for urging the cap portion.

17. The device of claim 14, wherein the second chuck comprises a support which is mounted to the drum, a clamp pivotably supported by the support, and an urging member for urging the clamp to press the sheet against the drum.

18. The device of claim 17, further comprising a chuck mounting element via which said support is detachably mounted onto the drum.

19. The device of claim 14, wherein said partitioning element is formed by an elastic member.

20. The device of claim 14, wherein said partitioning element has a shape which is complementary to a shape of the corresponding sucking groove.

* * * * *